(12) United States Patent
Pasadyn et al.

(10) Patent No.: US 6,675,058 B1
(45) Date of Patent: Jan. 6, 2004

(54) METHOD AND APPARATUS FOR CONTROLLING THE FLOW OF WAFERS THROUGH A PROCESS FLOW

(75) Inventors: Alexander J. Pasadyn, Austin, TX (US); Anthony J. Toprac, Austin, TX (US); Christopher A. Bode, Austin, TX (US); Joyce S. Oey Hewett, Austin, TX (US); Anastasia Oshelski Peterson, Austin, TX (US); Thomas J. Sonderman, Austin, TX (US); Michael L. Miller, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 104 days.

(21) Appl. No.: 09/821,630

(22) Filed: Mar. 29, 2001

(51) Int. Cl.$^7$ ............................................... G06F 19/00
(52) U.S. Cl. ........................... 700/121; 438/692; 451/5
(58) Field of Search .............................. 700/121, 1, 10, 700/17; 356/600; 438/692; 451/5

(56) References Cited

U.S. PATENT DOCUMENTS

| | | | | |
|---|---|---|---|---|
| 5,599,423 A | * | 2/1997 | Parker et al. ................ | 438/692 |
| 5,838,447 A | * | 11/1998 | Hiyama et al. ............. | 356/600 |
| 5,851,135 A | * | 12/1998 | Sandhu et al. .................. | 451/5 |
| 6,093,651 A | * | 7/2000 | Andideh et al. ............... | 216/38 |
| 6,120,348 A | * | 9/2000 | Fujita et al. ................. | 451/287 |
| 6,126,517 A | * | 10/2000 | Tolles et al. .................. | 451/41 |
| 6,154,714 A | * | 11/2000 | Lepejian ..................... | 700/121 |
| 6,159,075 A | * | 12/2000 | Zhang ............................ | 451/8 |
| 6,234,870 B1 | * | 5/2001 | Uzoh et al. .................... | 451/8 |
| 6,546,306 B1 | * | 4/2003 | Bushman et al. ........... | 700/121 |

* cited by examiner

*Primary Examiner*—Leo Picard
*Assistant Examiner*—Alexander Kosowski
(74) *Attorney, Agent, or Firm*—Williams, Morgan & Amerson, P.C.

(57) ABSTRACT

A method for controlling the flow of wafers through a process flow includes monitoring operating states of a plurality of processing tools adapted to process wafers; measuring a characteristic of a particular incoming wafer; identifying a particular processing tool having an operating state complimentary to the measured characteristic; and routing the particular incoming wafer to the particular processing tool for processing. A manufacturing system includes a plurality of processing tools adapted to process wafers and a process control server. The process control server is adapted to access metrology data related to a characteristic of a particular incoming wafer, identify a particular processing tool having an operating state complimentary to the characteristic, and route the particular incoming wafer to the particular processing tool for processing.

19 Claims, 3 Drawing Sheets

METHOD AND APPARATUS FOR CONTROLLING THE FLOW OF WAFERS THROUGH A PROCESS FLOW

BACKGROUND OF THE INVENTION

1. Field of the Invention

This invention relates generally to semiconductor device manufacturing, and, more particularly, to a method and apparatus for controlling the flow of wafers through a process flow.

2. Description of the Related Art

Chemical mechanical polishing (CMP) is a widely used means of planarizing silicon dioxide as well as other types of layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, the surface of the wafer is mechanically and chemically polished.

As semiconductor devices are scaled down, the importance of chemical mechanical polishing to the fabrication process increases. In particular, it becomes increasingly important to control and minimize within-wafer topography variations. For example, in one embodiment, to minimize spatial variations in downstream photolithography and etch processes, it is necessary for the oxide thickness of a wafer to be as uniform as possible (i.e., it is desirable for the surface of the wafer to be as planar as possible.)

Those skilled in the art will appreciate that a variety of factors may contribute to producing variations across the post-polish surface of a wafer. For example, variations in the surface of the wafer may be attributed to drift of the chemical mechanical polishing device. Typically, a chemical mechanical polishing device is optimized for a particular process, but because of chemical and mechanical changes to the polishing pad during polishing, degradation of process consumables, and other processing factors, the chemical mechanical polishing process may drift from its optimized state.

Generally, within-wafer uniformity variations (i.e., surface non-uniformity) are produced by slight differences in polish rate at various positions on the wafer. FIG. 1 illustrates two radial profiles of surface non-uniformity typically seen after an oxide polish of a wafer. The dished topography is often referred to as a center-fast polishing state because the center of the wafer polishes at a faster rate than the edge of the wafer. The domed topography is designated center-slow because the center of the wafer polishes at a slower rate than the edge of the wafer. For obvious reasons, the dished topography may also be referred to as edge-slow, and the domed topography may also be referred to as edge-fast.

In addition to process drift, pre-polish surface non-uniformity of the wafer may also contribute to producing variations across the post-polish surface of the wafer. For example, prior to being polished, the radial profile of the wafer may exhibit either a domed or dished topology, and the non-uniform polishing characteristics of the polishing tool may exacerbate non-uniformity problem.

One technique for reducing the post-process variability in a polishing tool involves measuring the pre-polish surface profile of the incoming wafers and automatically adjusting the operating recipe of the polishing tool to account for the non-uniformity. One variable controlled in the operating recipe is the arm oscillation length of the polishing tool. An exemplary automatic control technique is described in U.S. patent application Ser. No. 09/372,014, entitled, "METHOD AND APPARATUS FOR CONTROLLING WITHIN-WAFER UNIFORMITY IN CHEMICAL MECHANICAL POLISHING," and currently assigned to the assignee of the present application. The operating recipe of the polishing tool may be controlled on a lot-by-lot or wafer-by-wafer basis.

Adjusting the operating recipe for each incoming lot or wafer may not effectively control the post-polish variability. Typically, an automatic control technique reacts well to relatively small variations in a stable process. Incoming wafers, however, may have widely varying topologies. For example, one lot may have a dished topology, while the next lot has a domed topology. To transition between a dished and a domed topology, the operating recipe may have to be altered significantly. Such widely varying operating parameters reduce the effectiveness of an automatic controller.

Furthermore, a particular polishing tool may have an inherent tendency to polish wafers either center-fast or center-slow. For example, U.S. patent application Ser. No. 09/627,737, entitled, "METHOD AND APPARATUS FOR CONTROLLING WAFER UNIFORMITY IN A CHEMICAL MECHANICAL POLISHING TOOL USING CARRIER HEAD SIGNATURES," and currently assigned to the assignee of the present application, describes a technique that includes grouping carrier heads with similar processing characteristics in a multi-head polishing tool. Such a grouping may increase the likelihood of a center-fast or center-slow tendency in the polishing tool. Attempting to force a polishing tool having an inherent tendency to polish in accordance with one polishing profile to polish using the other type of profile may also reduce the effectiveness of the automatic controller and lead to increased post-polish variability.

There are other types of processing tools that have similar tool state issues. For example, in a plasma etch tool, the plasma power affects the rate of etch in the center relative to that at the edge. Generally, a lower plasma power results in an increased etch rate in the center relative to the edge. The specific relationship between power and etch rate is dependent on factors such as the particular etch tool and the recipe being used. The relationship for a particular configuration may be determined empirically and a mathematical model may be derived. Adjusting the plasma power for each incoming lot of wafers may also result in decreased automatic controller effectiveness issues similar to those described above for a polishing tool.

The present invention is directed to overcoming, or at least reducing the effects of, one or more of the problems set forth above.

SUMMARY OF THE INVENTION

One aspect of the present invention is seen in a method for controlling the flow of wafers through a process flow. The method includes monitoring operating states of a plurality of processing tools adapted to process wafers; measuring a characteristic of a particular incoming wafer; identifying a particular processing tool having an operating state complimentary to the measured characteristic; and routing the particular incoming wafer to the particular processing tool for processing.

Another aspect of the present invention is seen in a manufacturing system including a plurality of processing tools adapted to process wafers and a process control server. The process control server is adapted to access metrology data related to a characteristic of a particular incoming wafer, identify a particular processing tool having an operating state complimentary to the characteristic, and route the particular incoming wafer to the particular processing tool for processing.

BRIEF DESCRIPTION OF THE DRAWINGS

The invention may be understood by reference to the following description taken in conjunction with the accompanying drawings, in which like reference numerals identify like elements, and in which.

Figure 1:
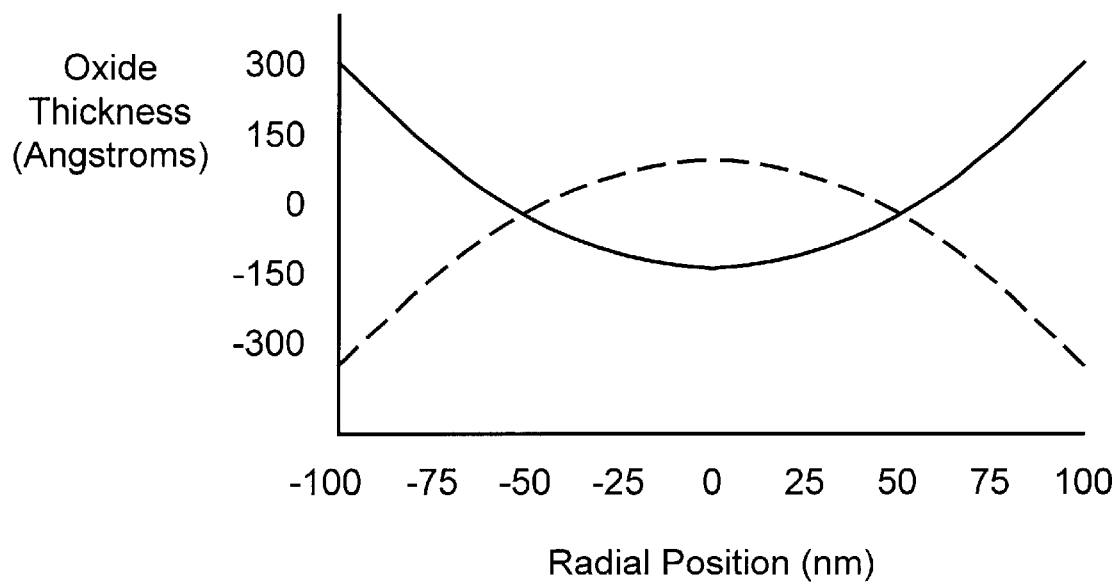
FIG. 1 is a graph illustrating surface non-uniformity of a wafer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
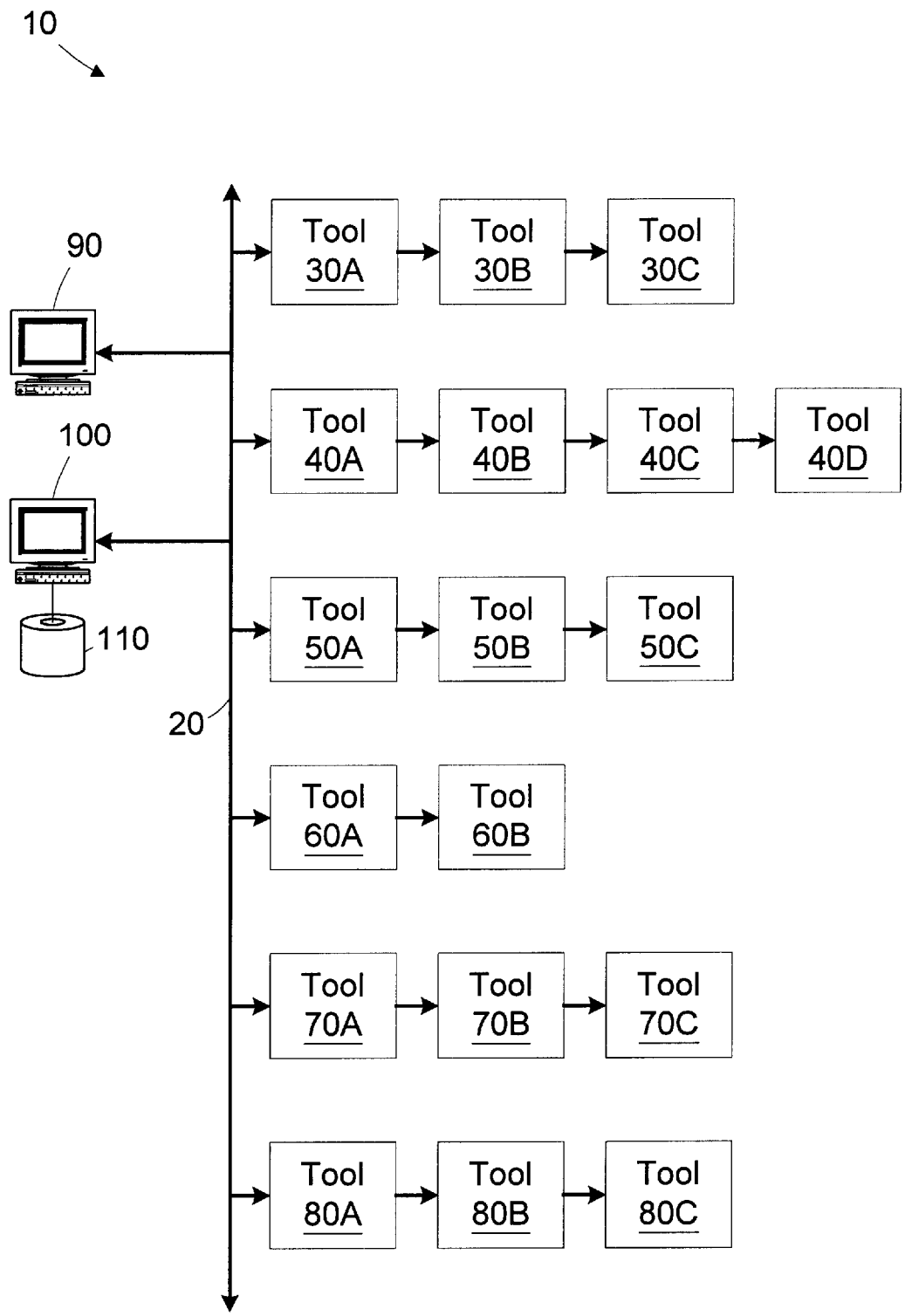
FIG. 2 is a simplified block diagram of a manufacturing system in accordance with one illustrative embodiment of the present invention.

Referring to FIG. 2, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20.

A process control server 90 directs the high level operation of the manufacturing system 10 by directing the process flow. The process control server 90 monitors the status of the various entities in the manufacturing system 10, including the tools 30–80. A database server 100 is provided for storing data related to the status of the various entities and articles of manufacture (e.g., wafers) in the process flow. The database server 100 may store information in one or more data stores 110. The data may include pre-process and post-process metrology data, tool states, process flow activities (e.g., scheduled maintenance events, processing routes for lots of wafers), etc. The distribution of the processing and data storage functions amongst the different computers is generally conducted to provide independence and a central information store. Of course, more or less computers may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The tools 30–80 are grouped into sets of like tools, as denoted by lettered suffixes. A particular wafer or lot of wafers progresses through the tools 30–80 as it is being manufactured, with each tool 30–80 performing a specific function in the process flow. Exemplary processing tools 30–80, include photolithography steppers, etch tools, deposition tools, polishing tools, rapid thermal processing tools, implantation tools, etc. Some of the tools 30–80 may also be metrology tools adapted to measure characteristics (e.g., surface profiles) of the wafers being processed. In the illustrated embodiment, the set of tools 30A–30C represent etch tools, and the set of tools 70A–70C represent polishing tools. Typically, the path a particular wafer or lot passes through the process flow varies. The process control server 90 routes the individual lots through the process flow depending on the steps that need to be performed and the availabilities of the tools 30–80. A particular lot of wafers may pass through the same tool 30–80 more than once in its production (e.g., a particular etch tool 30 may be used for more than one etch operation).

The tools 30–80 are illustrated in a rank and file grouping for illustrative purposes only. In an actual implementation, the tools may be arranged in any order of grouping. Additionally, the connections between the tools in a particular group are meant to represent only connections to the network 20, rather than interconnections between the tools.

The process control server 90 controls the path of a particular lot of wafers through the tools 30–80. Based on process data, the process control server 90 monitors the operating states of the tools 30–80. The process data may include pre-and post process measurements of wafers progressing through the tools 30–80. For example, if a particular polishing tool, e.g., 70A, is operating in a state that favors center-fast polishing, the process control server 90 notes that tendency. The process control server 90 may also monitor the operating states of other tools, such as the etch tools 30 to determine if the current state of the etch tool favors center-fast or center-slow etching.

The process control server 90 may initiate pre-processing and/or post-processing metrology events as necessary to determine the operating states of the tools 30–80. The data from the metrology events may be returned to the process control server 90 (or some other computing resource on the network 20) and analyzed. Alternatively, the process control server 90 may access process data already collected and stored in the data store 110. For example, pre-process and post-process metrology data may have been collected for various tools to generate statistical data for process control and/or fault detection.

The process control server 90 evaluates the current operating states of the tools 30–80 as it determines the particular routing of a lot of wafers through the process flow of the manufacturing system 10. For example, prior to performing a polishing procedure on a particular lot, the process controller 90 first determines the surface profile (e.g., dished or domed) of the wafers in the lot. The process control server 90 may initiate a metrology event to determine the surface profile or access the data store 110 for the information. After determining the incoming surface profile, the process control server 90 evaluates the current operating states of the polishing tools 70A–70C to determine which tool(s) have a tendency to polish in a manner complimentary to the incoming surface profile. If the incoming surface profile is dished, the process control server 90 selects a polishing tool 70A–70C operating in a center-slow state. Similarly, if the incoming surface profile is domed, the process control server 90 selects a polishing tool 70A–70C operating in a center-fast state.

A similar approach may be applied to an etch process. The process control server 90 selects the particular etch tool 30A–30C having an operating state complimentary to the incoming surface profile. If the incoming surface profile is dished, the process control server 90 selects an etch tool 30A–30C operating in a center-slow state. Similarly, if the incoming surface profile is domed, the process control server 90 selects an etch tool 30A–30C operating in a center-fast state.

Figure 3:
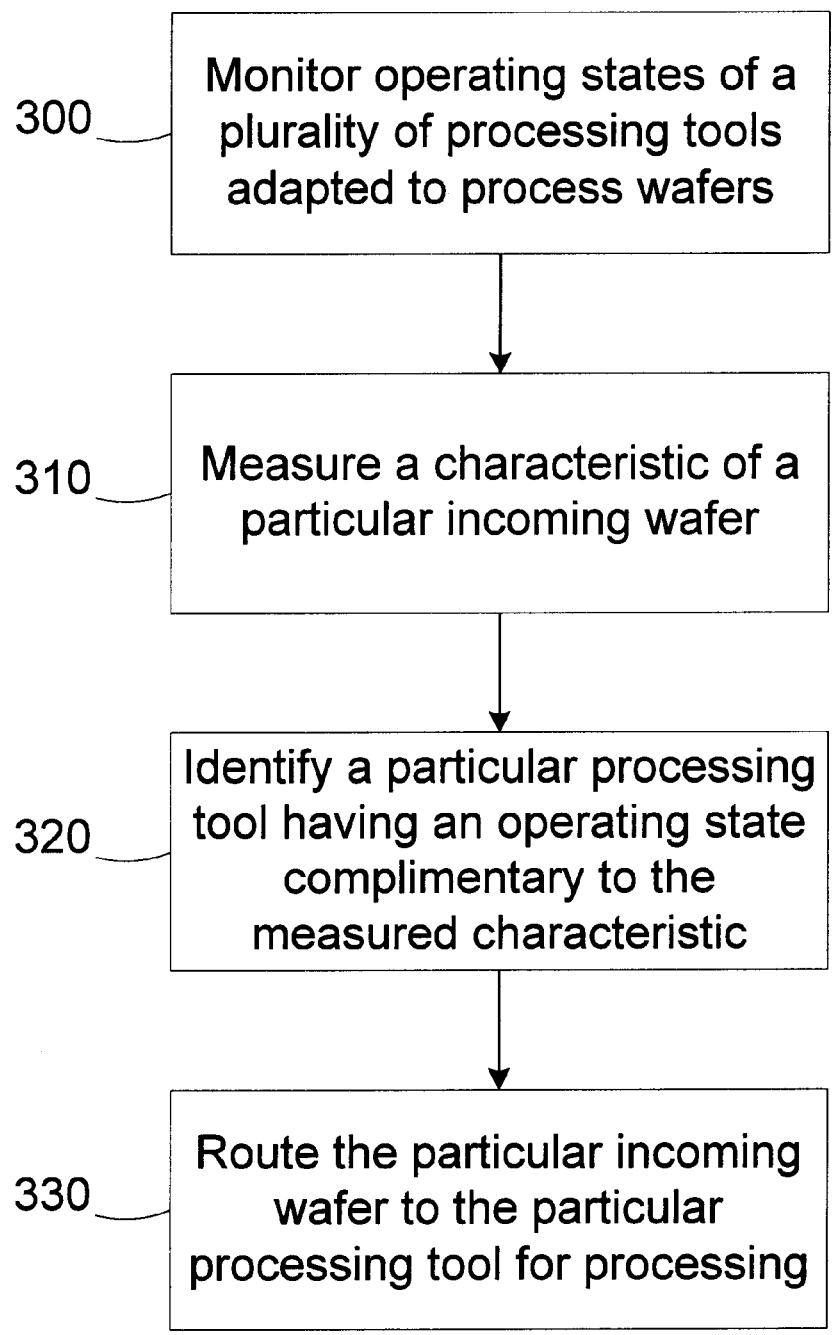
FIG. 3 is a simplified flow diagram of a method for controlling the flow of wafers through a process flow in accordance with another illustrative embodiment of the present invention.

Turning now to FIG. 3, a simplified flow diagram of a method for controlling the flow of wafers through a process flow in accordance with another illustrative embodiment of the present invention is provided. In block 300, operating states of a plurality of processing tools adapted to process wafers are monitored. Monitoring the operating states may include determining whether the processing tools have either a center-fast processing tendency or a center-slow processing tendency. In block 310, a characteristic of a particular incoming wafer is measured. The characteristic may be the surface profile of the wafer (e.g., dished or domed). In block 320, a particular processing tool having an operating state complimentary to the measured characteristic is identified. For example, if the incoming surface profile is dished, a processing tool having a center-slow processing tendency is selected. In block 330, the particular incoming wafer is routed to the particular processing tool for processing.

Selecting tools 30–80 having operating states complimentary to the incoming surface profiles as described above has numerous advantages. The perturbations to the tool controller responsible for directing the process performed by the particular tool may be reduced. This reduction in the variation seen in the incoming wafer profiles allows the tool controllers to more effectively control the operation of the tool and results in decreased variation in the wafers leaving the tool. Reduced variation equates directly to reduced process cost, increased device performance, and increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling the flow of wafers through a process flow, comprising:

monitoring processing tendencies of a plurality of processing tools adapted to process wafers, the processing tendency of a particular processing tool affecting processing of a region on a processed wafer;

measuring a characteristic of a particular incoming wafer;

identifying a particular processing tool having a processing tendency complimentary to the measured characteristic by comparing the processing tendencies and the measured characteristic; and routing the particular incoming wafer to the particular processing tool for processing.

2. The method of claim 1, wherein monitoring the processing tendencies comprises determining if the processing tools have a center-fast processing tendency.

3. The method of claim 1, wherein monitoring the processing tendencies comprises determining if the processing tools have a center-slow processing tendency.

4. The method of claim 1, wherein measuring the characteristic comprises measuring a surface profile of the particular incoming wafer.

5. The method of claim 4, wherein measuring the surface profile comprises determining if the particular incoming wafer has one of a dished surface profile and a domed surface profile.

6. The method of claim 5, wherein identifying the particular processing tool comprises identifying one of the processing tools having a center-slow processing tendency in response to the particular incoming wafer having a dished surface profile.

7. The method of claim 5, wherein identifying the particular processing tool comprises identifying one of the processing tools having a center-fast processing tendency in response to the particular incoming wafer having a domed surface profile.

8. The method of claim 7, wherein the processing tools comprise polishing tools, and monitoring the processing tendencies comprises determining if the polishing tools have one of a center-slow polishing tendency and a center-fast polishing tendency.

9. The method of claim 7, wherein the processing tools comprise etch tools, and monitoring the processing tendencies comprises determining if the etch tools have one of a center-slow etching tendency and a center-fast etching tendency.

10. A manufacturing system, comprising:

a plurality of processing tools adapted to process wafers; and a process control server adapted to monitor processing tendencies of a plurality of processing tools, the processing tendency of a particular processing tool affecting processing of a region on a processed wafer;, access metrology data related to a characteristic of a particular incoming wafer, identify a particular processing tool having a processing tendency complimentary to the characteristic by comparing the processing tendency and the measured characteristic, and route the particular incoming wafer to the particular processing tool for processing.

11. The manufacturing system of claim 10, wherein the process control server is adapted to determine if the processing tools have a center-fast processing tendency.

12. The manufacturing system of claim 10, wherein the process control server is adapted to determine if the processing tools have a center-slow processing tendency.

13. The manufacturing system of claim 10, wherein the characteristic comprises a surface profile of the particular incoming wafer.

14. The manufacturing system of claim 13, wherein the surface profile comprises one of a dished surface profile and a domed surface profile.

15. The manufacturing system of claim 14, wherein the process control server is adapted to identify one of the processing tools having a center-slow processing tendency in response to the particular incoming wafer having a dished surface profile.

16. The manufacturing system of claim 14, wherein the process control server is adapted to identify one of the processing tools having a center-fast processing tendency in response to the particular incoming wafer having a domed surface profile.

17. The manufacturing system of claim 16, wherein the processing tools comprise polishing tools, and the processing tendencies comprise one of a center-slow polishing tendency and a center-fast polishing tendency.

18. The manufacturing system of claim 16, wherein the processing tools comprise etch tools, and the processing tendencies comprise one of a center-slow etching tendency and a center-fast etching tendency.

19. A manufacturing system, comprising:

means for monitoring processing tendencies of a plurality of processing tools adapted to process wafers, the processing tendency of a particular processing tool affecting processing of a region on a processed wafer;

means for measuring a characteristic of a particular incoming wafer;

means for identifying a particular processing tool having a processing tendency complimentary to the characteristic by comparing the processing tendencies and the measured characteristic; and means for routing the particular incoming wafer to the particular processing tool for processing.

* * * * *